United States Patent
Lee et al.

(10) Patent No.: US 7,635,626 B2
(45) Date of Patent: Dec. 22, 2009

(54) METHOD OF MANUFACTURING DYNAMIC RANDOM ACCESS MEMORY

(75) Inventors: Cheng-Che Lee, Shalu Township, Taichung County (TW); Tao-Yi Chang, Dali (TW); Tsung-De Lin, Taichung (TW)

(73) Assignee: ProMos Technologies Inc., Hsinchu (TW)

( * ) Notice: Subject to any disclaimer, the term of this patent is extended or adjusted under 35 U.S.C. 154(b) by 367 days.

(21) Appl. No.: 11/767,222

(22) Filed: Jun. 22, 2007

(65) Prior Publication Data
US 2008/0274602 A1   Nov. 6, 2008

(30) Foreign Application Priority Data
Mar. 6, 2007   (TW) ............................. 96107624 A

(51) Int. Cl.
*H01L 21/8242* (2006.01)
(52) U.S. Cl. .............................. 438/243; 257/E21.646; 257/E21.658
(58) Field of Classification Search ................ 438/243, 438/244, 386; 257/E21.646, E21.657, E21.658
See application file for complete search history.

(56) References Cited

U.S. PATENT DOCUMENTS

2005/0012128 A1 * 1/2005 Bae .............................. 257/296
2006/0205141 A1 * 9/2006 Park et al. .................... 438/239

\* cited by examiner

*Primary Examiner*—Walter L Lindsay, Jr.
*Assistant Examiner*—Reema Patel
(74) *Attorney, Agent, or Firm*—J.C. Patents

(57) ABSTRACT

A method of manufacturing a DRAM includes firstly providing a substrate. Many transistors are then formed on the substrate. Next, a first and a second LPCs are formed between the transistors. A first dielectric layer is then formed on the substrate, and a first opening exposing the first LPC is formed in the first dielectric layer. Thereafter, a barrier layer is formed on the first dielectric layer. Afterwards, a BLC is formed in the first opening, and a BL is formed on the first dielectric layer. A liner layer is then formed on a sidewall of the BL. Next, a second dielectric layer having a dry etching rate substantially equal to that of the liner layer and having a wet etching rate larger than that of the liner layer is formed on the substrate. Finally, an SNC is formed in the first and the second dielectric layers.

17 Claims, 4 Drawing Sheets

METHOD OF MANUFACTURING DYNAMIC RANDOM ACCESS MEMORY

CROSS-REFERENCE TO RELATED APPLICATION

This application claims the priority benefit of Taiwan application serial no. 96107624, filed on Mar. 6, 2007. All disclosure of the Taiwan application is incorporated herein by reference.

BACKGROUND OF THE INVENTION

1. Field of the Invention

The present invention relates to a method of manufacturing a memory, and more particularly to a method of manufacturing a dynamic random access memory (DRAM).

2. Description of Related Art

With the development of powerful microprocessors, the software is more capable of programming and calculating an increasing amount of data. Therefore, the fabrication of memories is essential in the semiconductor industry. A dynamic random access memory (DRAM) is a volatile memory (VM) and is formed by a plurality of memory cells. Each memory cell herein is mainly composed of a transistor and a capacitor, and all memory cells are electrically connected to one another through word lines (WLs) and bit lines (BLs). In addition, said capacitor is generally called a storage node (SN).

Due to an increase in integrity of devices, the DRAM devices are miniaturized to meet market demands. Thus, the DRAM having a capacitor-over-bit-line (COB) structure has been developed. In general, the COB-structured DRAM is fabricated by forming a shallow trench isolation (STI) structure in a substrate to define an active area of the memory cell and then forming the transistor in the active area. After that, a dielectric layer isolates the transistor, and a bit line contact (BLC) opening is then formed in the dielectric layer. Thereafter, the BLC connecting the transistor is formed in the BLC opening and the BL connecting the BLC is formed on the dielectric layer. Afterwards, another dielectric layer is formed on the BL, and a storage node contact (SNC) opening is formed in said two dielectric layers. Next, an SNC is formed in the SNC opening and an SN is formed on the second dielectric layer.

However, during the formation of said DRAM, the lattice of the material of a barrier layer below the BL is usually altered due to excessive manufacturing temperature, and thereby the material is connected to the SNC by passing through a spacer of the SNC, resulting in a short circuit between the BL and the SNC.

SUMMARY OF THE INVENTION

In view of the foregoing, the present invention is directed to a method of manufacturing a DRAM. The method is capable of preventing the material of a barrier layer below a BL from passing through a spacer of an SNC, such that an occurrence of a short circuit between the BL and the SNC can be avoided.

The present invention provides a method of manufacturing a DRAM. The method includes firstly providing a substrate. A plurality of transistors is then formed on the substrate. Next, a first and a second landing pad contacts (LPCs) are formed between the transistors. Thereafter, a first dielectric layer is formed on the substrate. After that, a first opening is formed in the first dielectric layer, and the first opening exposes the first LPC. Afterwards, a barrier layer is conformally formed on the first dielectric layer. Next, a BLC is formed in the first opening, and a BL is formed on the first dielectric layer. Here, the BL and the BLC are electrically connected to each other. A liner layer is then formed on the sidewall of the BL. Thereafter, a second dielectric layer is formed on the substrate. Here, the dry etching rate of the second dielectric layer is substantially equal to that of the liner layer, and the wet etching rate of the second dielectric layer exceeds that of the liner layer. Finally, an SNC is formed in the second dielectric layer and in the first dielectric layer, and the SNC is electrically connected to the second LPC.

According to one embodiment of the present invention, the material of the liner layer is, for example but not limited to, silicon-rich oxide (SRO) in the method of manufacturing the DRAM.

According to one embodiment of the present invention, the liner layer is, for example, fabricated through performing a chemical vapor deposition (CVD) process in the method of manufacturing the DRAM.

According to one embodiment of the present invention, the material of the barrier layer is, for example but not limited to, titanium (Ti)/titanium nitride (TiN) in the method of manufacturing the DRAM.

According to one embodiment of the present invention, the material of the first dielectric layer is, for example but not limited to, borophosphosilicate glass (BPSG) in the method of manufacturing the DRAM.

According to one embodiment of the present invention, the material of the second dielectric layer is, for example but not limited to, high density plasma (HDP) oxide in the method of manufacturing the DRAM.

According to one embodiment of the present invention, a spacer is further formed on the sidewall of the BL after the BL is formed and before the liner layer is constructed in the method of manufacturing the DRAM.

According to one embodiment of the present invention, the material of the spacer is, for example but not limited to, silicon nitride in the method of manufacturing the DRAM.

According to one embodiment of the present invention, the method of forming the SNC includes, for example, first forming a second opening in the second dielectric layer and in the first dielectric layer, and after that, a conductive layer is formed in the second opening.

According to one embodiment of the present invention, a wet etching process is further implemented after the second opening is formed and before the conductive layer is constructed in the method of manufacturing the DRAM.

According to one embodiment of the present invention, a spacer is further formed on the sidewall of the second opening after the wet etching process is implemented and before the conductive layer is constructed in the method of manufacturing the DRAM.

According to one embodiment of the present invention, the material of the spacer is, for example but not limited to, silicon nitride in the method of manufacturing the DRAM.

According to one embodiment of the present invention, the material of the SNC is, for example but not limited to, polysilicon in the method of manufacturing the DRAM.

According to one embodiment of the present invention, the material of the BLC and that of the BL are, for example but not limited to, tungsten in the method of manufacturing the DRAM.

According to one embodiment of the present invention, the material of the first LPC is, for example but not limited to, polysilicon in the method of manufacturing the DRAM.

According to one embodiment of the present invention, the material of the second LPC is, for example but not limited to, polysilicon in the method of manufacturing the DRAM.

According to one embodiment of the present invention, an SN is further formed on the SNC after the SNC is constructed in the method of manufacturing the DRAM.

According to the present invention, the liner layer is formed on the sidewall of the BL and on the sidewall of the barrier layer. Thereby, during the formation of the DRAM, the alteration of the lattice of Ti in the barrier layer due to excessive manufacturing temperature can be prevented, and voids are not formed in the spacer of the SNC on account of stress. Accordingly, Ti in the barrier layer will not pass through the voids in the spacer of the SNC and contact the SNC, and the short circuit between the BL and the SNC can be further avoided.

In order to make the aforementioned and other objects, features and advantages of the present invention more comprehensible, several embodiments accompanied with figures are described in detail below.

DESCRIPTION OF EMBODIMENTS

FIGS. 1A through 1D are top views depicting a process of manufacturing a DRAM according to an embodiment of the present invention. FIGS. 2A and 2B are cross-sectional schematic views along plane I-I' of FIGS. 1A and 1B, respectively. FIGS. 2C and 2D are cross-sectional schematic views along plane II-II' of FIGS. 1C and 1D, respectively.

Figure 1A:
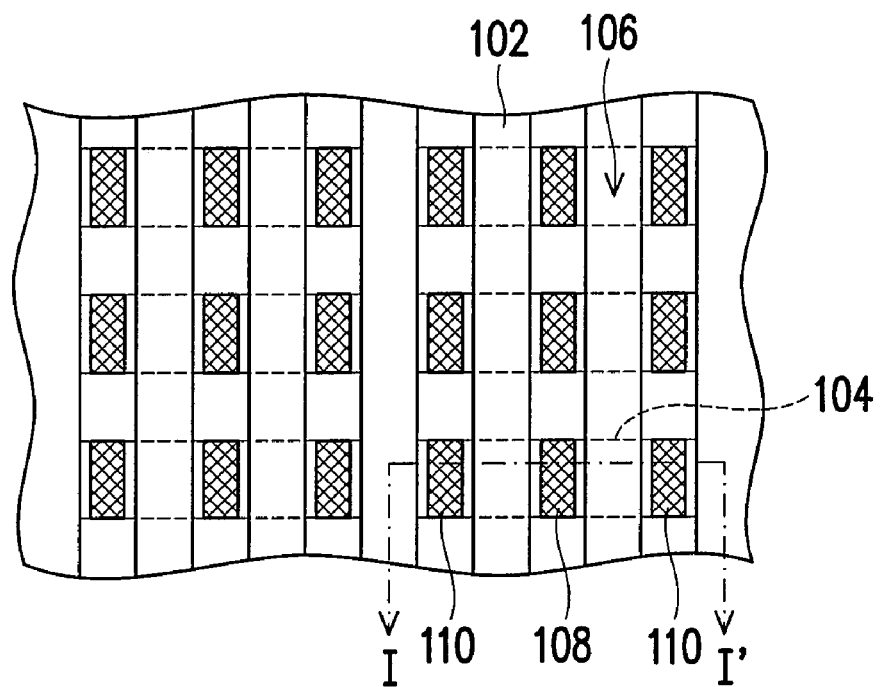
FIGS. 1A through 1D are top views depicting a process of manufacturing a DRAM according to an embodiment of the present invention.
Figure 2A:
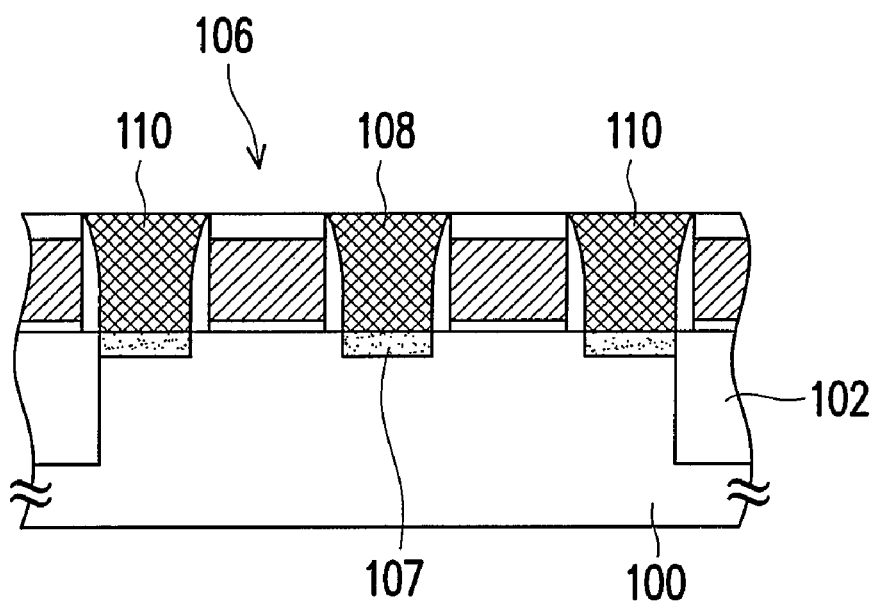
FIGS. 2A and 2B are cross-sectional schematic views along plane I-I' of FIGS. 1A and 1B, respectively.
Figure 2B:
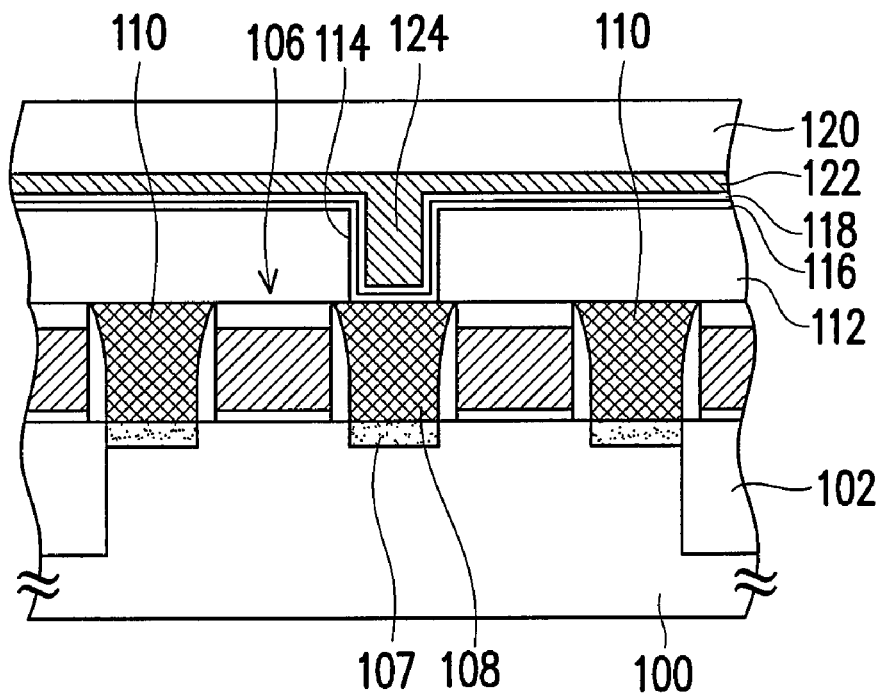
Figure 2C:
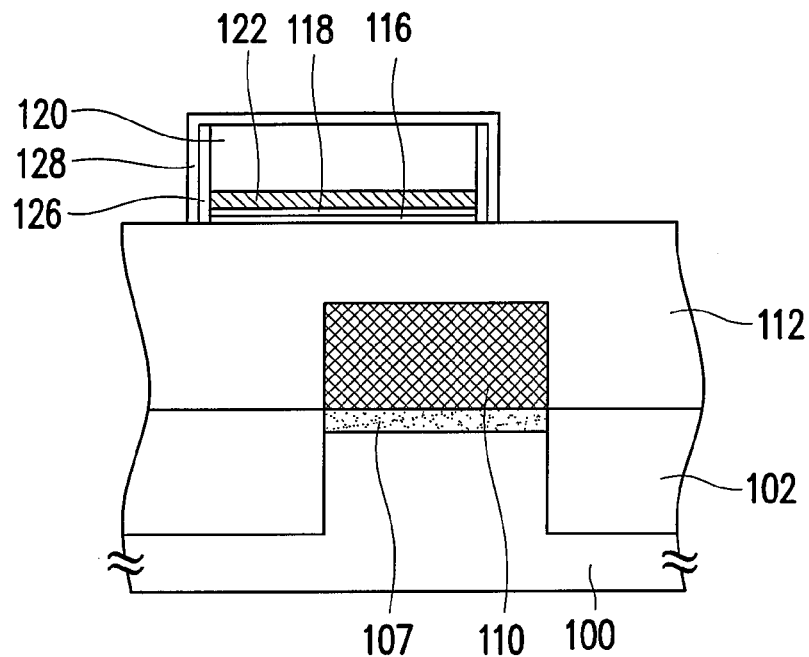
FIGS. 2C and 2D are cross-sectional schematic views along plane II-II' of FIGS. 1C and 1D, respectively.
Figure 2D:
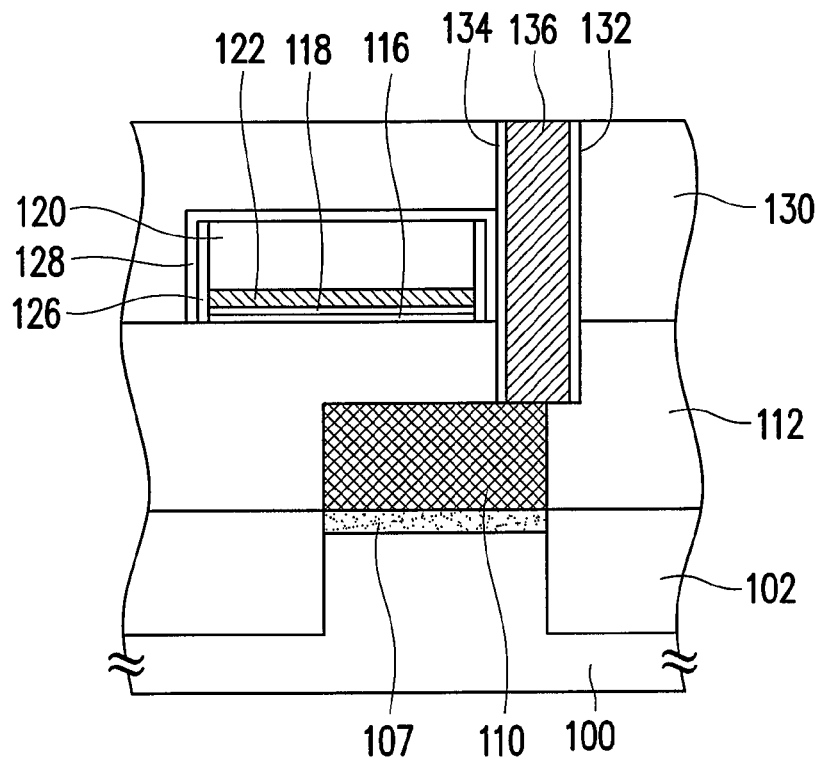

First, referring to FIGS. 1A and 2A, a substrate 100 is provided. An isolation structure 102 is then formed in the substrate 100, so as to define an active area 104 on the substrate 100. The isolation structure 102 is, for example but not limited to, an STI structure, and the method of forming the isolation structure 102 includes firstly forming a trench (not shown) in the substrate 100 and filling an insulating material in the trench, for example. Next, transistors 106 are formed on the substrate 100. The transistors 106 are fabricated through firstly forming an oxide layer (not shown), a polysilicon layer (not shown) and a silicon nitride layer (not shown) on the substrate 100 sequentially. Next, the silicon nitride layer, the polysilicon layer and the oxide layer are defined to form a cap layer, a gate and a gate dielectric layer of each of the transistors 106. Thereafter, a spacer and a source/drain region 107 of each of the transistors 106 are formed, and the fabrication of the transistors 106 is completed.

After that, referring to FIGS. 1A and 2A again, an LPC 108 and an LPC 110 are formed between the transistors 106. The LPCs 108 and 110 are fabricated through forming one polysilicon layer (not shown) on the substrate 100 and performing a chemical mechanical polishing (CMP) operation until the cap layer of one of the transistors 106 is exposed, for example.

Figure 1B:
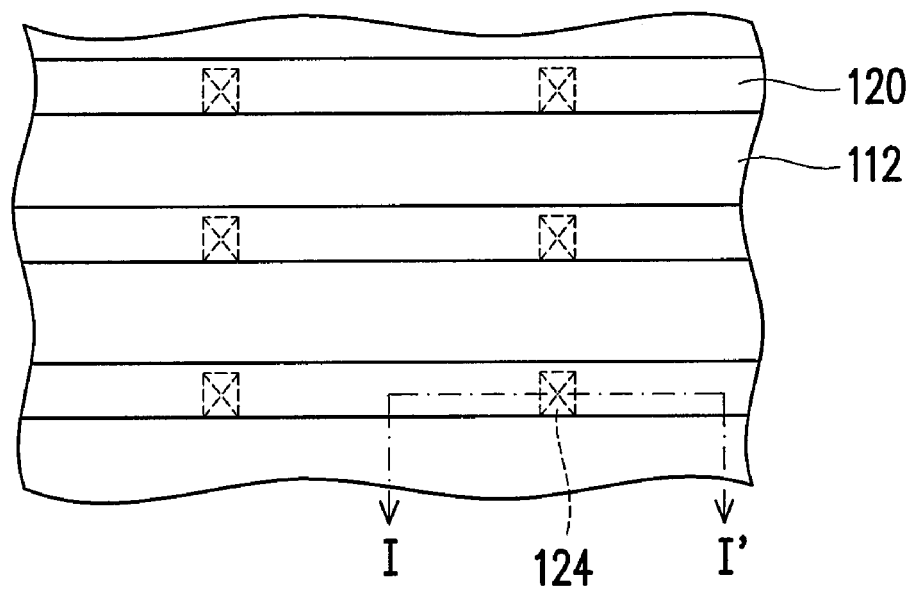

Next, referring to FIGS. 1B and 2B, a dielectric layer 112 is formed on the substrate 100. The material of the dielectric layer 112 includes BPSG, for example, and the method of forming the dielectric layer 112 includes performing a CVD process, for example. Afterwards, a photolithography process and an etching process are carried out to form an opening 114 in the dielectric layer 112 and to expose the LPC 108. Next, a Ti layer 116 and a TiN layer 118 are conformally formed on the dielectric layer 112 as a barrier layer. Thereafter, a rapid thermal annealing (RTA) process is generally performed, such that the Ti in the barrier layer and the surrounding silicon together form titanium silicide (TiSi). Besides, after the implementation of the RTA process, another TiN layer (not shown) may be alternatively formed on the TiN layer 118 as a glue layer.

After that, referring to FIGS. 1B and 2B again, a metal layer (not shown) is formed on the substrate 100 to fill the opening 114. The material of the metal layer is, for example but not limited to, tungsten. Next, a patterned hard mask layer 120 is formed on the metal layer. The material of the patterned hard mask layer 120 is, for example but not limited to, silicon nitride. An etching process is then performed with use of the patterned hard mask layer 120 as a mask, and the metal layer exposed by the patterned hard mask layer 120 and the barrier layer below the metal layer are removed, such that a BL 122 is defined on the dielectric layer 112, and that a BLC 124 electrically connected to the BL 122 is formed in the opening 114.

Figure 1C:
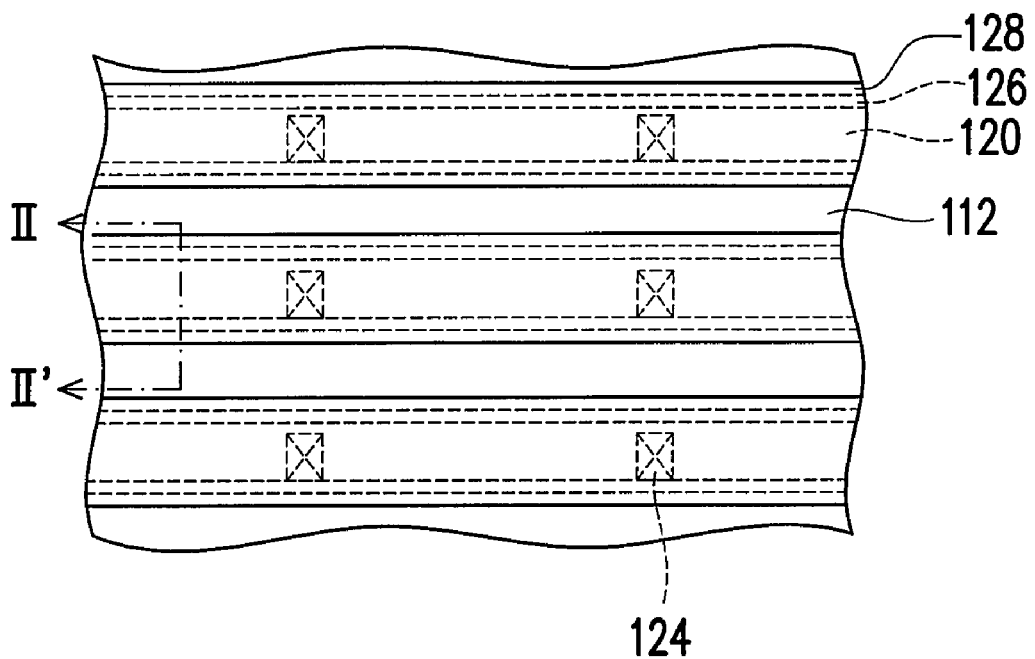

Next, referring to FIGS. 1C and 2C together, a spacer 126 is formed on the sidewall of the BL 122. The material of the spacer 126 is, for example but not limited to, silicon nitride, and the method of forming the spacer 126 includes conformally forming a silicon nitride layer on the dielectric layer 112 at first and performing an anisotropic etching process, for example. Afterwards, a liner layer 128 is conformally formed on the dielectric layer 112 as a passivation layer of the BL 122 and the barrier layer. The material of the liner layer 128 is, for example but not limited to, SRO, and the method of forming the liner layer 128 includes performing an in-situ CVD process or an ex-situ CVD process.

Figure 1D:
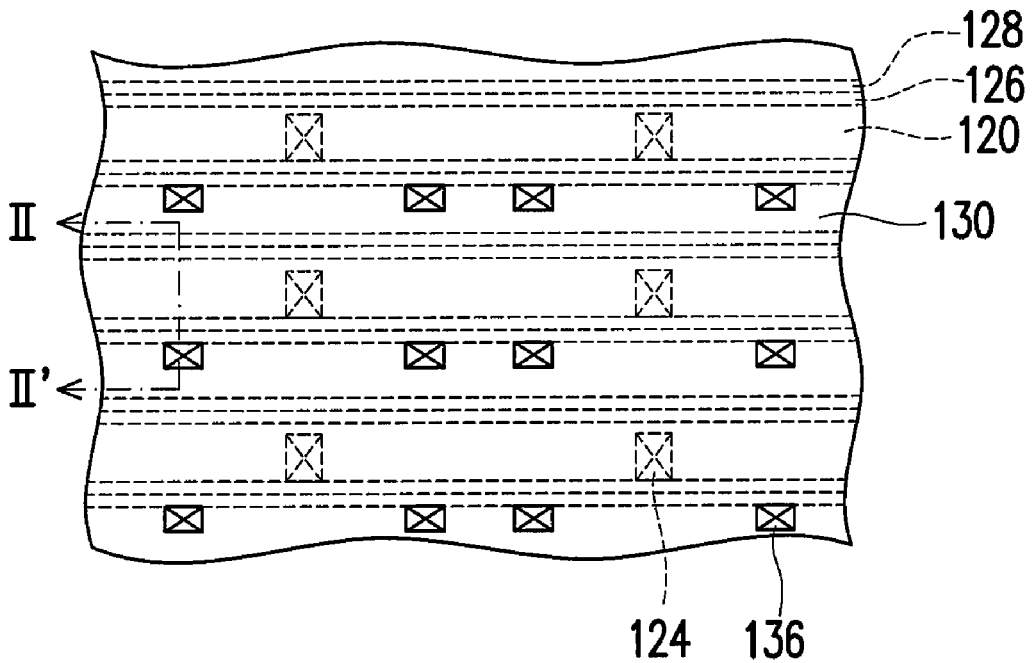

Next, referring to FIGS. 1D and 2D, a dielectric layer 130 is formed on the substrate 100. The dry etching rate of the dielectric layer 130 is substantially equal to that of the liner layer 128, while the wet etching rate of the dielectric layer 130 exceeds that of the liner layer 128. According to the present embodiment, the material of the dielectric layer 130 is, for example but not limited to, an HDP oxide. The CMP process is then implemented to planarize the dielectric layer 130.

Thereafter, referring to FIGS. 1D and 2D again, the photolithography process and a dry etching process are carried out to form an opening 132 in the dielectric layer 130 and to expose the LPC 110. In general, not only is the dielectric layer 130 but also is a small portion of the liner layer 128 removed due to layer-to-layer alignment during the implementation of the dry etching process. Besides, the dry etching rate of the dielectric layer 130 is substantially equal to that of the liner layer 128, and thus the opening 132 can be smoothly formed by removing the dielectric layer 130 and a small portion of the liner layer 128 during the dry etching process without being blocked by the liner layer 128.

More particularly, after the formation of the opening 132, the width of the opening 132 is overly narrow in most cases, which is unfavorable to subsequent manufacturing processes. Accordingly, a wet etching process may be alternatively performed to remove a portion of the dielectric layer 130, and thereby the width of the opening 132 can be expanded. Said wet etching process is normally called a buffer oxide etching (BOE) process, and the performing time thereof is approximately 40 seconds. In addition, the wet etching rate of the dielectric layer 130 exceeds that of the liner layer 128. Therefore, the liner layer 128 can still remain on the sidewall of the BL 122 and on the sidewall of the barrier layer during the implementation of the wet etching process.

Next, referring to FIGS. 1D and 2D again, a spacer 134 is formed on the sidewall of the opening 132. The material of the spacer 134 is, for example but not limited to, silicon nitride, and the method of forming the spacer 134 includes conformally forming a silicon nitride layer on the dielectric layer 130 at first and performing the anisotropic etching process, for example. A conductive layer 136 is then formed in the opening 132 to form an SNC electrically connected to the LPC 110. The material of the conductive layer 136 is, for example but not limited to, polysilicon, and the method of forming the conductive layer 136 includes firstly forming a conductive material layer (not shown) on the dielectric layer 130 and performing the CMP process to remove the conductive material layer outside the opening 132.

After that, the fabrication of an SN is performed to form the SN (not shown) on the SNC. As the fabrication of the SN is well known by one skilled in the art, it will not be further explained herein.

In summary, according to the present invention, the liner layer as the passivation layer is formed on the sidewall of the BL and on the sidewall of the barrier layer after the BL is constructed. Thereby, during the formation of the DRAM, the alteration of the lattice of Ti of the barrier layer due to excessive manufacturing temperature can be prevented. Moreover, the liner layer is used as a buffer layer between Ti of the barrier layer and the spacer of the SNC, and thus the voids are not formed in the spacer on account of stress. Further, Ti in the barrier layer will not pass through the voids in the spacer of the SNC and contact the SNC, and the short circuit between the BL and the SNC can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dynamic random access memory (DRAM), comprising:
   providing a substrate;
   forming a plurality of transistors on the substrate;
   forming a first and a second landing pad contacts (LPCs) between the transistors;
   forming a first dielectric layer on the substrate;
   forming a first opening in the first dielectric layer, wherein the first opening exposes the first LPC;
   conformally forming a barrier layer on the first dielectric layer;
   forming a bit line contact (BLC) in the first opening and forming a bit line (BL) on the first dielectric layer, wherein the BL and the BLC are electrically connected to each other;
   forming a liner layer on the sidewall of the BL;
   forming a second dielectric layer on the substrate, wherein the dry etching rate of the second dielectric layer is substantially equal to that of the liner layer, and the wet etching rate of the second dielectric layer exceeds that of the liner layer; and
   forming a storage node contact (SNC) in the second dielectric layer and in the first dielectric layer, wherein the SNC and the second LPC are electrically connected to each other.

2. The method of manufacturing the DRAM as claimed in claim 1, wherein the material of the liner layer comprises silicon-rich oxide (SRO).

3. The method of manufacturing the DRAM as claimed in claim 1, wherein the method of forming the liner layer comprises performing a chemical vapor deposition (CVD) process.

4. The method of manufacturing the DRAM as claimed in claim 1, wherein the material of the barrier layer comprises titanium (Ti)/titanium nitride (TiN).

5. The method of manufacturing the DRAM as claimed in claim 1, wherein the material of the first dielectric layer comprises borophosphosilicate glass (BPSG).

6. The method of manufacturing the DRAM as claimed in claim 1, wherein the material of the second dielectric layer comprises high density plasma (HDP) oxide.

7. The method of manufacturing the DRAM as claimed in claim 1, wherein a spacer is further formed on the sidewall of the BL after the BL is formed and before the liner layer is constructed.

8. The method of manufacturing the DRAM as claimed in claim 7, wherein the material of the spacer comprises silicon nitride.

9. The method of manufacturing the DRAM as claimed in claim 1, wherein the method of forming the SNC comprises:
   forming a second opening in the second dielectric layer and in the first dielectric layer; and
   forming a conductive layer in the second opening.

10. The method of manufacturing the DRAM as claimed in claim 9, wherein a wet etching process is further implemented after the second opening is formed and before the conductive layer is constructed.

11. The method of manufacturing the DRAM as claimed in claim 10, wherein a spacer is further formed on the sidewall of the second opening after the wet etching process is implemented and before the conductive layer is constructed.

12. The method of manufacturing the DRAM as claimed in claim 11, wherein the material of the spacer comprises silicon nitride.

13. The method of manufacturing the DRAM as claimed in claim 1, wherein the material of the SNC comprises polysilicon.

14. The method of manufacturing the DRAM as claimed in claim 1, wherein the material of the BLC and the material of the BL comprise tungsten.

15. The method of manufacturing the DRAM as claimed in claim 1, wherein the material of the first LPC comprises polysilicon.

16. The method of manufacturing the DRAM as claimed in claim 1, wherein the material of the second LPC comprises polysilicon.

17. The method of manufacturing the DRAM as claimed in claim 1, wherein a storage node (SN) is further formed on the SNC after the SNC is constructed.

* * * * *